(12) United States Patent
Roh et al.

(10) Patent No.: US 8,589,618 B2
(45) Date of Patent: Nov. 19, 2013

(54) MEMORY SYSTEM COMPRISING NONVOLATILE MEMORY DEVICE AND CONTROLLER

(75) Inventors: Kangho Roh, Seoul (KR); Hea-Young Roh, Hwaseong-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 783 days.

(21) Appl. No.: 12/726,713

(22) Filed: Mar. 18, 2010

(65) Prior Publication Data

US 2010/0268869 A1    Oct. 21, 2010

(30) Foreign Application Priority Data

Apr. 20, 2009    (KR) .................. 10-2009-0034220

(51) Int. Cl.
*G06F 12/00* (2006.01)
*G06F 13/00* (2006.01)
*G06F 13/28* (2006.01)

(52) U.S. Cl.
USPC .......................................... 711/103; 711/115

(58) Field of Classification Search
None
See application file for complete search history.

(56) References Cited

U.S. PATENT DOCUMENTS

| | | | |
|---|---|---|---|
| 2002/0013879 A1 | 1/2002 | Han | |
| 2005/0138288 A1 * | 6/2005 | Chou et al. | 711/115 |
| 2005/0160219 A1 * | 7/2005 | Oh | 711/103 |
| 2005/0251617 A1 * | 11/2005 | Sinclair et al. | 711/103 |
| 2006/0047889 A1 | 3/2006 | Sasaki et al. | |
| 2006/0053246 A1 * | 3/2006 | Lee | 711/100 |
| 2008/0086631 A1 * | 4/2008 | Chow et al. | 713/2 |
| 2008/0098164 A1 * | 4/2008 | Lee et al. | 711/103 |
| 2010/0262818 A1 * | 10/2010 | Lee | 713/2 |

FOREIGN PATENT DOCUMENTS

| | | |
|---|---|---|
| JP | 11297078 A | 10/1999 |
| JP | 2006072441 A | 3/2006 |
| JP | 2007280329 A | 10/2007 |
| KR | 1019990075161 B1 | 12/2001 |

* cited by examiner

*Primary Examiner* — Yaima Rigol
(74) *Attorney, Agent, or Firm* — Volentine & Whitt, PLLC (57) ABSTRACT

A memory system includes a nonvolatile memory device and a controller. The controller includes a working memory and is configured to control the nonvolatile memory device. The nonvolatile memory device is configured to store drive data required to access the nonvolatile memory device. When an initialization operation of the memory system is performed, the controller activates an operation standby signal after loading a portion of the drive data stored in the nonvolatile memory device into the working memory.

12 Claims, 7 Drawing Sheets

MEMORY SYSTEM COMPRISING NONVOLATILE MEMORY DEVICE AND CONTROLLER

CROSS-REFERENCE TO RELATED APPLICATIONS

This application claims priority under 35 U.S.C. §119 to Korean Patent Application No. 10-2009-0034220 filed on Apr. 20, 2009, the disclosure of which is hereby incorporated by reference in its entirety.

BACKGROUND

Embodiments of the inventive concept relate generally to a semiconductor memory device. More particularly, embodiments of the inventive concept relate to a memory system comprising a nonvolatile memory device and a controller.

Semiconductor memory devices can be roughly divided into two categories based on whether they retain stored data when disconnected from power. These categories include volatile memory devices, which lose stored data when disconnected from power, and nonvolatile memory devices, which retain stored data when disconnected from power.

Examples of volatile memory devices include dynamic random access memory (DRAM), static random access memory (SRAM), and examples of nonvolatile memory devices include electrically erasable programmable read only memory (EEPROM), ferroelectric random access memory (FRAM), phase-change random access memory (PRAM), magnetoresistive random access memory (MRAM), and flash memory.

In recent years, there has been an increase in the number of devices employing nonvolatile memory devices. As examples, nonvolatile memory devices are being used increasingly in MP3 players, digital cameras, cellular phones, camcorders, flash cards, solid state drives (SSDs), to name but a few. In addition, there has also been an increase in the overall storage capacity of nonvolatile memory devices, resulting in a tremendous amount of nonvolatile data storage in use today.

SUMMARY

Embodiments of the inventive concept provide a memory system and related methods of operation.

According to one embodiment of the inventive concept, a memory system comprises a nonvolatile memory device and a controller. The controller comprises a working memory and is configured to control the nonvolatile memory device. The nonvolatile memory device stores drive data for accessing the nonvolatile memory device. During an initialization operation of the memory system, the controller activates an operation standby signal after loading a sub-portion of the drive data stored in the nonvolatile memory device into the working memory.

In certain embodiments, the controller loads an additional sub-portion of the drive data stored in the nonvolatile memory device into the working memory after activating the operation standby signal.

In certain embodiments, the controller loads the additional sub-portion of the drive data into the working memory after detecting a state of a request from a host and determining that the state of the request is idle.

In certain embodiments, the controller is configured to receive a request from the host, detect a sub-portion of the drive data required to perform an operation indicated by the request, and upon detecting the sub-portion of the drive data required to perform the operation indicated by the request, load the detected sub-portion into the working memory as an additional sub-portion of the drive data.

In certain embodiments, the size of the additional another portion of the drive data is set so that a time of loading another portion of the drive data into the working memory is shorter than a response standby time of a host.

In certain embodiments, a sub-portion of the drive data comprises code and wherein another sub-portion of the drive data comprises a mapping table representing a relationship between logical addresses and physical addresses of the nonvolatile memory device.

In certain embodiments, another sub-portion of the drive data comprises mapping data representing an address region in which the mapping table is stored. In certain embodiments, another sub-portion of the drive data comprises a table corresponding to an address region in which a file system among the mapping tables is stored. In certain embodiments, another a sub-portion of the drive data comprises a booting code. In certain embodiments, another sub-portion of the drive data comprises a table corresponding to an address region in which an operating system among the mapping tables is stored.

In certain embodiments, the nonvolatile memory device is a flash memory device.

According to one embodiment of the inventive concept a system comprises a nonvolatile memory device and a controller. The nonvolatile memory device stores drive data comprising (a) operating data used to perform different memory access operations on the nonvolatile memory device, and (b) meta-data comprising information about the operations associated with different parts of the mapping table. The controller comprises a working memory and configured to control the nonvolatile memory device. During an initialization operation of the memory system, the controller activates an operation standby signal after loading the meta-data from the nonvolatile memory device into the working memory but before loading the operating data into the working memory.

In certain embodiments, the operating data comprises a memory mapping table divided into multiple parts each containing mappings between logical and physical addresses of the nonvolatile memory device, and the meta-data comprises information regarding the logical addresses that can be accessed with each of the multiple parts of the mapping table.

In certain embodiments, the operating data comprises code used by the controller to control memory access operations.

In certain embodiments, the system further comprises a host that sends requests to the controller to initiate memory access operations on the nonvolatile memory device after receiving the operation standby signal, and the controller receives requests from the host, and upon receiving such a request, examines the meta-data to determine whether operating data required to satisfy the request has been loaded into the working memory.

In certain embodiments, the controller loads the required operating data to the working memory as a consequence of determining that the operating data required to satisfy the request has not been loaded into the working memory.

BRIEF DESCRIPTION OF THE DRAWINGS

Embodiments of the inventive concept are described below with reference to the accompanying drawings. In the drawings, like reference numbers denote like features.

DETAILED DESCRIPTION OF THE EMBODIMENTS

Selected embodiments of the inventive concept are described below with reference to the accompanying drawings. These embodiments are provided as teaching examples and should not be construed to limit the scope of the inventive concept.

Figure 1:
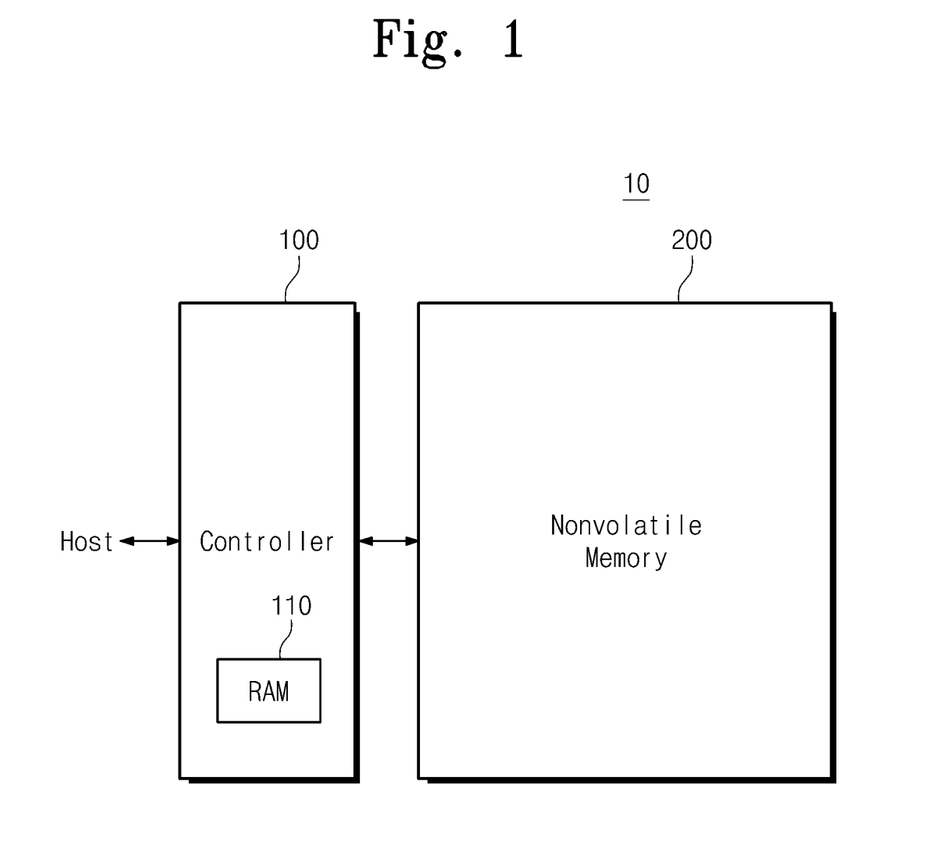
FIG. 1 is a block diagram of a memory system in accordance with an embodiment of the inventive concept.

FIG. 1 is a block diagram illustrating a memory system 10 in accordance with an embodiment of the inventive concept. Referring to FIG. 1, memory system 10 comprises a controller 100 and a nonvolatile memory device 200.

Controller 100 is connected to a host and nonvolatile memory device 200. Controller 100 transfers data read from nonvolatile memory device 200 to the host and stores data transferred from the host in nonvolatile memory device 200.

Controller 100 comprises a random access memory (RAM) 110. RAM 110 may be used as a working memory of controller 100. In some embodiments, RAM 110 comprises a volatile RAM such as DRAM, SRAM and SDRAM. In other embodiments, RAM 110 comprises a nonvolatile RAM such as a NOR flash memory, PRAM, RRAM, MRAM and FRAM. In addition, controller 100 may further comprise well known elements such as a processing unit, a host interface and a memory interface.

The host interface may implement a protocol for performing data exchange between the host and controller 100. For instance, controller 100 may be configured to communicate with the host (or other external elements) through one of various interface protocols such as universal serial bus (USB), multimedia card (MMC), peripheral component interconnection (PCI-E), integrated technology attachment (ATA), serial-ATA, parallel-ATA, small computer small interface (SCSI), enhanced small disk interface (ESDI), or integrated drive electronics (IDE). Controller 100 may further comprise a memory interface for interfacing with nonvolatile memory device 200.

Nonvolatile memory device 200 comprises a memory cell array to store data, a read/write circuit to read and write data from the memory cell array and write data to the memory cell array, an address decoder to decode addresses transferred from the outside to transfer the decoded data to the read/write circuit and a control logic to control the operation of nonvolatile memory device 200. An embodiment of nonvolatile memory device 200 will be described in further detail below with reference to FIG. 2.

In some embodiments, memory system 10 further comprises an error correction block. The error correction block detects errors in data read from nonvolatile memory device 200 and corrects the errors. Such an error correction block may be included, for instance, in nonvolatile memory device 200.

In some embodiments, controller 100 and nonvolatile memory device 200 are both integrated into a single semiconductor device. For instance, controller 100 and nonvolatile memory device 200 may be integrated as one semiconductor device to constitute a memory card. Examples of such memory cards include a PC card or a PCMCIA card, a compact flash (CF) card, a smart media (SM) card, a memory stick, a multimedia card (MMC, RS-MMC, MMCmicro), an SD card (SD, miniSD, microSD), and a universal flash memory device (UFS).

In some embodiments, controller 100 and nonvolatile memory device 200 may be integrated as a single semiconductor device in a solid state drive (SSD). Where memory system 10 is used as a solid state drive (SSD), the operating speed of a host connected to memory system 10 may be greatly improved.

In certain embodiments, memory system 10 is incorporated in various devices, such as a computer, a portable computer, an ultra mobile PC (UMPC), a work station, a net book, personal digital assistant (PDA), a web tablet, a wireless phone, a mobile phone, a smart phone, a digital camera, a digital audio recorder, a digital audio player, a digital picture recorder, a digital picture player, a digital video recorder, a digital video player, a device that can transmit and receive data in a wireless environment, one of various electronic devices constituting a home network, one of various electronic devices constituting a computer network, one of various electronic devices constituting a telemetric network, one of various components constituting a computing system such as an SSD or a memory card.

In some embodiments, memory system 10 or nonvolatile memory device 200 is mounted in one of various package configurations, such as a package on package (PoP), ball grid array (BGA), chip scale package (CSP), plastic leaded chip carrier (PLCC), plastic dual in-line package (PDIP), die in waffle pack, die in wafer form, chip on board (COB), ceramic dual in-line package (CERDIP), plastic metric quad flat pack (MQFP), thin quad flat pack (TQFP), small outline (SOIC), shrink small outline package (SSOP), thin small outline (TSOP), thin quad flatpack (TQFP), system in package (SIP), multi chip package (MCP), wafer-level fabricated package (WFP) and wafer-level processed stack package (WSP).

Figure 2:
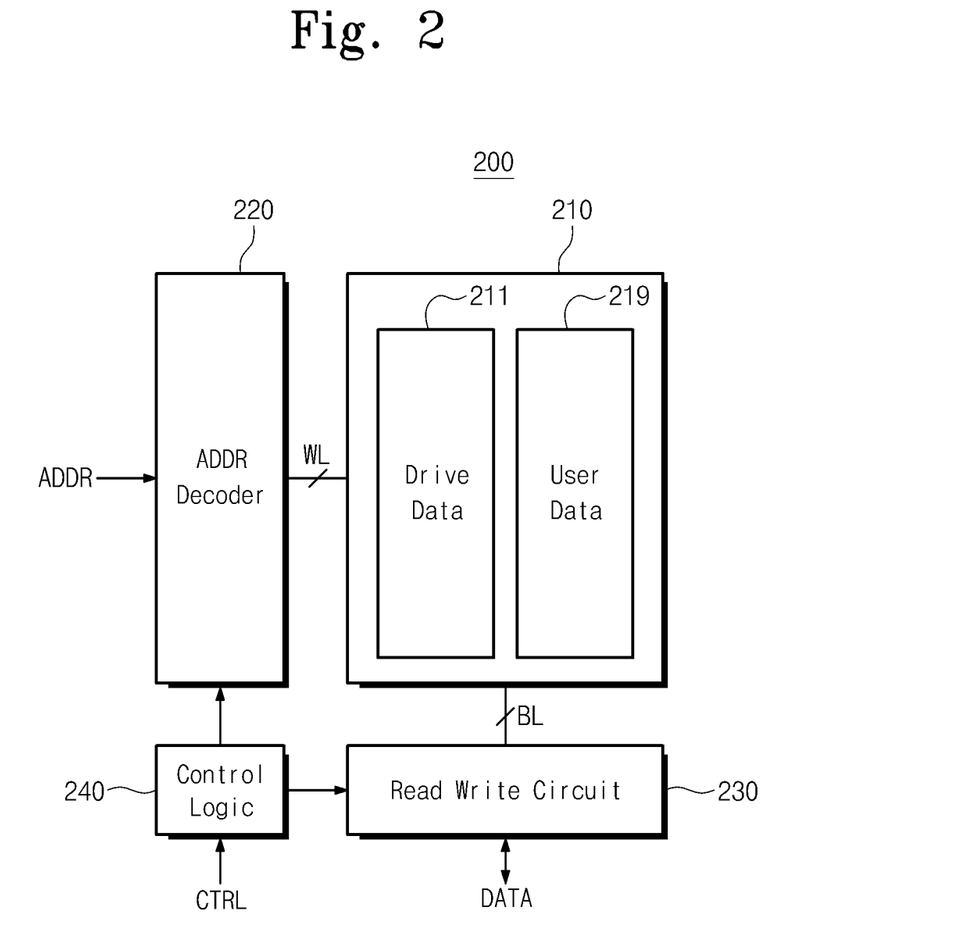
FIG. 2 is a block diagram of a nonvolatile memory device illustrated in FIG. 1.

FIG. 2 is a block diagram illustrating an embodiment of nonvolatile memory device 200 of FIG. 1. In the embodiment of FIG. 2, nonvolatile memory device 200 comprises a memory cell array 210, an address decoder 220, a read/write circuit 230 and control logic 240.

Memory cell array 210 is connected to address decoder 220 via word lines WL and is connected to read/write circuit 230 through bit lines BL. Memory cell array 210 comprises a plurality of memory blocks. Each of the memory blocks comprises a plurality of memory cells. Rows of the memory cells are connected to word lines WL and columns of the memory cells are connected to the bit lines BL. In various alternative embodiments, the memory cells may store various numbers of bits per cell. For instance, in some embodiments, the memory cells may store one bit per cell and in some embodiments, the memory cells may store two or more bits per cell.

Address decoder 220 is connected to memory cell array 210 via word lines WL. Address decoder 220 operates under the control of control logic 240. Address decoder 220 receives an address ADDR from an external source, such as controller 100.

Address decoder 220 decodes a row address from address ADDR and selects one of word lines WL using the decoded row address. Address decoder 220 also decodes a column address from the transferred address ADDR and transfers the decoded column address to read/write circuit 230. Address decoder 220 typically comprises elements such as a row decoder, a column decoder and an address buffer.

Read/write circuit 230 is connected to memory cell array 210 via bit lines BL and is connected to a data input/output circuit via data lines DL. Read/write circuit 230 operates under the control of control logic 240. Read/write circuit 230 receives a decoded column address from address decoder 220 and selects bit lines BL based on the decoded column address. Additionally, read/write circuit 230 exchanges data with external elements. For instance, in the illustrated embodiment, read/write circuit 230 exchanges data with controller 100 of FIG. 1.

In particular, read/write circuit 230 receives data from controller 100 and writes the received data in memory cell array 210. Read/write circuit 230 also reads data from memory cell array 210 and transfers the read data to controller 100. Read/write circuit 230 may also read data from a first storage region of memory cell array 210 and write the read data in a second storage region of memory cell array 210 in a copy-back operation.

Read/write circuit 230 typically comprises elements such as a page buffer, a column select circuit and a data buffer. In some embodiments, read/write circuit 230 also comprises elements such as a sense amplifier, a write driver, a column select circuit and a data buffer.

Control logic 240 is connected to address decoder 220 and read/write circuit 230. Control logic 240 controls the operation of nonvolatile memory device 200. Control logic 240 operates in response to a control signal CTRL received from an external source, such as controller 100 of FIG. 1.

Memory cell array 210 stores drive data 211 and user data 219. Drive data 211 comprises data used by memory system 10 to perform operations requested by the host. For instance, in some embodiments, drive data 211 comprises data for handling read, write and erase operations requested by the host.

Drive data 211 may further comprise code used by controller 100 to control nonvolatile memory device 200 in response to requests from the host. For instance, drive data 211 may comprise code for handling read, write and erase requests from the host. Drive data 211 may further comprise code used by controller 100 to perform background operations such as garbage collection, merge and wear leveling.

Where nonvolatile memory device 200 comprises a flash memory device, logical and physical addresses used by nonvolatile memory device 200 may be different from each other. Accordingly, drive data 211 may further comprise a mapping table for mapping the logical addresses to the physical addresses. Thus, if the host requests an operation related to a particular logical address, the mapping table may be used to identify the appropriate physical address to access within nonvolatile memory device 200.

User data 219 comprises data that can be written, read and erased by a user. For instance, user data 219 may comprise text data, audio data, image data, an operating system and an application.

A storage region of memory cell array 210 may be physically divided (e.g., into memory block units), with the drive data and user data stored in physically divided storage regions. As examples, the drive data may be stored in a first region of memory cell array 210 and the user data may be stored in a second region of memory cell array 210.

The storage region of memory cell array 210 may also be logically divided (e.g., by addresses), with the drive data and user data stored in logically divided storage regions. As examples, the drive data may be stored in a first region of memory cell array 210 and the user data may be stored in a second region of memory cell array 210.

In some embodiments, nonvolatile memory device 200 comprises a flash memory device. However, nonvolatile memory device 200 could alternatively be implemented with other types of nonvolatile memory, such as ROM, PROM, EPROM, EEPROM, a flash memory device, PRAM, MRAM, RRAM and FRAM.

Memory cell array 210 of flash memory device 200 stores drive data 211 and user data 219. As indicated above, drive data 211 may comprise code used by memory system 10 to perform requests of the host. For example, drive data 211 may comprise code for driving a firmware of memory system 10. Drive data 211 may comprise code for driving a flash translation layer of memory system 10.

Drive data 211 typically comprises a mapping table representing a relation between a logical address and a physical address of the flash memory device 200. Alternatively, drive data 211 may simply comprise information regarding the mapping table, such as a physical address where the mapping table is stored.

As the storage capacity of the flash memory device 200 increases, the size of the drive data 211 may increase accordingly. For example, as a storage capacity of the flash memory device 200 increases, the number of addresses of flash memory device 200 may also increase, causing the size of the mapping table to increase as well.

Drive data 211 typically comprises data used by memory system 10 to perform operations requested by the host. Thus, in an initialization operation of memory system 10, drive data 211 stored in flash memory device 200 is loaded into RAM 110 of controller 100. As the size of drive data 211 increases, the time required to load drive data 211 into RAM 110 from flash memory device 200 may increase as well. That is, as the storage capacity of the flash memory device 200 increases, the time of an initialization operation of memory system 10 may increase. If the time of the initialization operation becomes longer than a response standby time of the host, a problem such as time-out may occur. Accordingly, to prevent this from happening, memory system 10 transfers an operation standby signal to the host after loading a portion of drive data 211 into RAM 110. Thus, an initialization operation time of memory system 10 is reduced.

Figure 3:
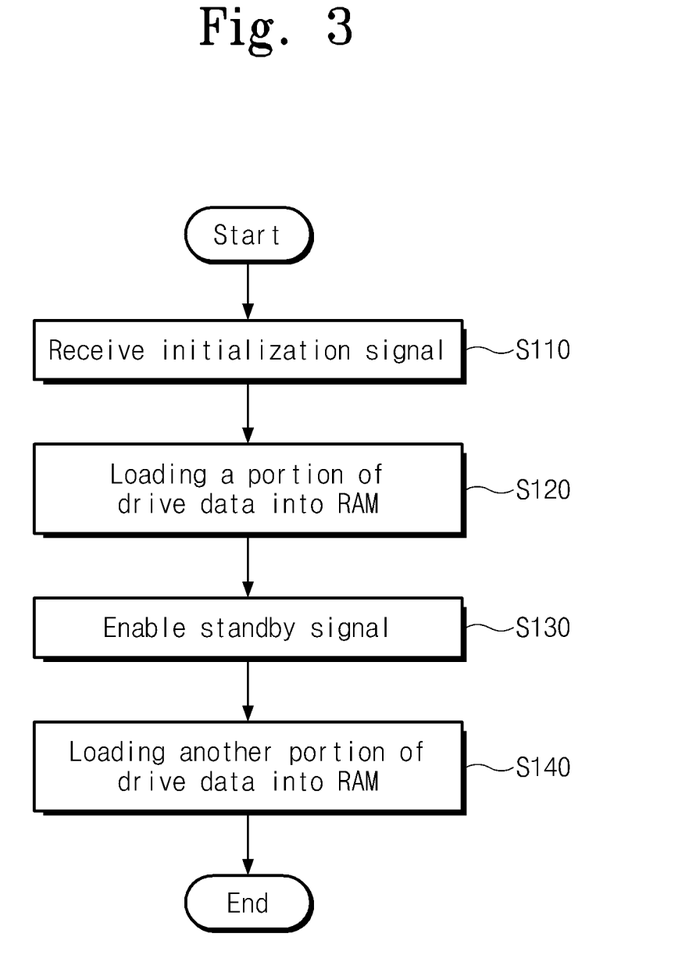
FIG. 3 is a flow chart illustrating an initialization operation of the memory system of FIG. 1.
Figure 4:
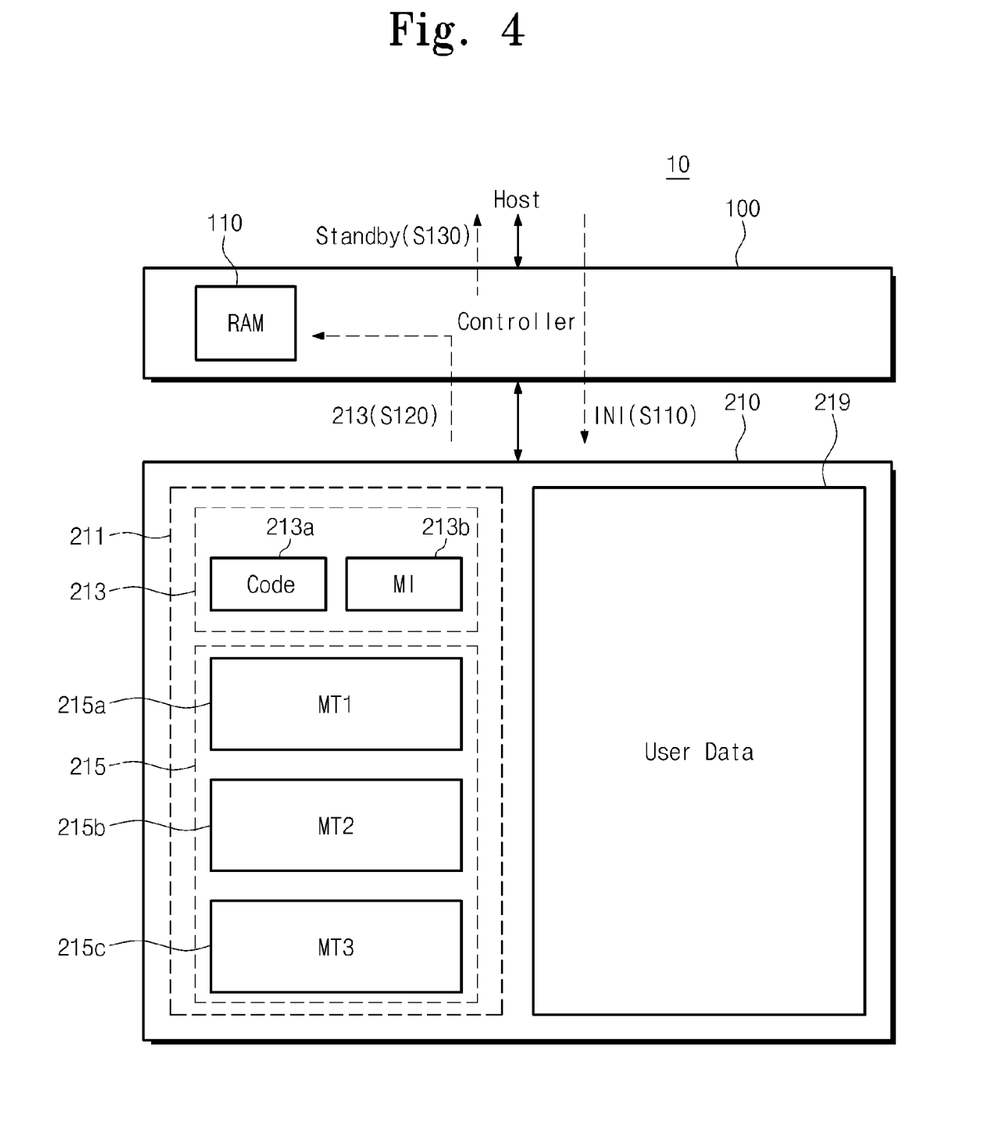
FIG. 4 is a block diagram illustrating the operation of the memory system in accordance with the flow chart of FIG. 3.

FIG. 3 is a flow chart illustrating an initialization operation of memory system 10, and FIG. 4 is a block diagram illustrating the operation of memory system 10 in accordance with the flow chart of FIG. 3. For simplicity of explanation, FIG. 4 shows memory cell array 210 and controller 100, but omits address decoder 220, read/write circuit 230, control logic 240.

Referring to FIGS. 3 and 4 an initialization signal INI is received by controller 100 in a step S110. Initialization signal INI is typically provided from the host and may comprise a reset signal or a power-on signal. Initialization signal INI may also be generated inside memory system 10. It may be, for instance, a reset signal generated inside memory system 10 or a power-on signal. In the case of the power-on signal, memory system 10 may generate initialization signal INI upon detecting that a power supply provided to memory system 10 has reached a predetermined level. In some embodiments, the power supply is provided to memory system 10 from the host, and in some embodiments, the power supply is provided to memory system 10 from a separate power supply device.

Next, in a step S120, a portion of drive data 211 is loaded into a working memory of controller 100. In this embodiment, the working memory is implemented as a RAM 110. However, other types of working memory could be used as alternatives to RAM 110.

A portion of drive data 211 comprises code 213a. Code 213a may be used, for instance, to perform read, write and erase operations in response to requests from the host. Drive data 211 further comprises mapping data 213b, which represents a region, such as a physical address, where a mapping table 215 is stored.

Next, in a step S130, an operation standby signal is generated by memory system 10 and transferred to the host. Upon receiving the operation standby signal, the host recognizes that initialization of memory system 10 has been completed. Accordingly, upon receiving the operation standby signal, the host may transfer requests to memory system 10.

As described above, memory system 10 activates an operation standby time after loading only a portion of drive data 211 into RAM 110. Thus, an initialization operation time of memory system 10 is reduced.

In general, the operation signal transferred from memory system 10 to the host may be any signal indicating completion of an initialization operation of memory system 10. For instance, the signal transferred to the host from memory system 10 may simply be a ready/busy signal.

In a step S140, another portion of drive data 211 is loaded into a RAM. That is, a portion 215 of drive data 211 that has not been loaded into RAM 110 of controller 100 is loaded into RAM 110. The loading of this additional portion of drive data 211 into RAM 110 is described in further detail below.

Figure 5:
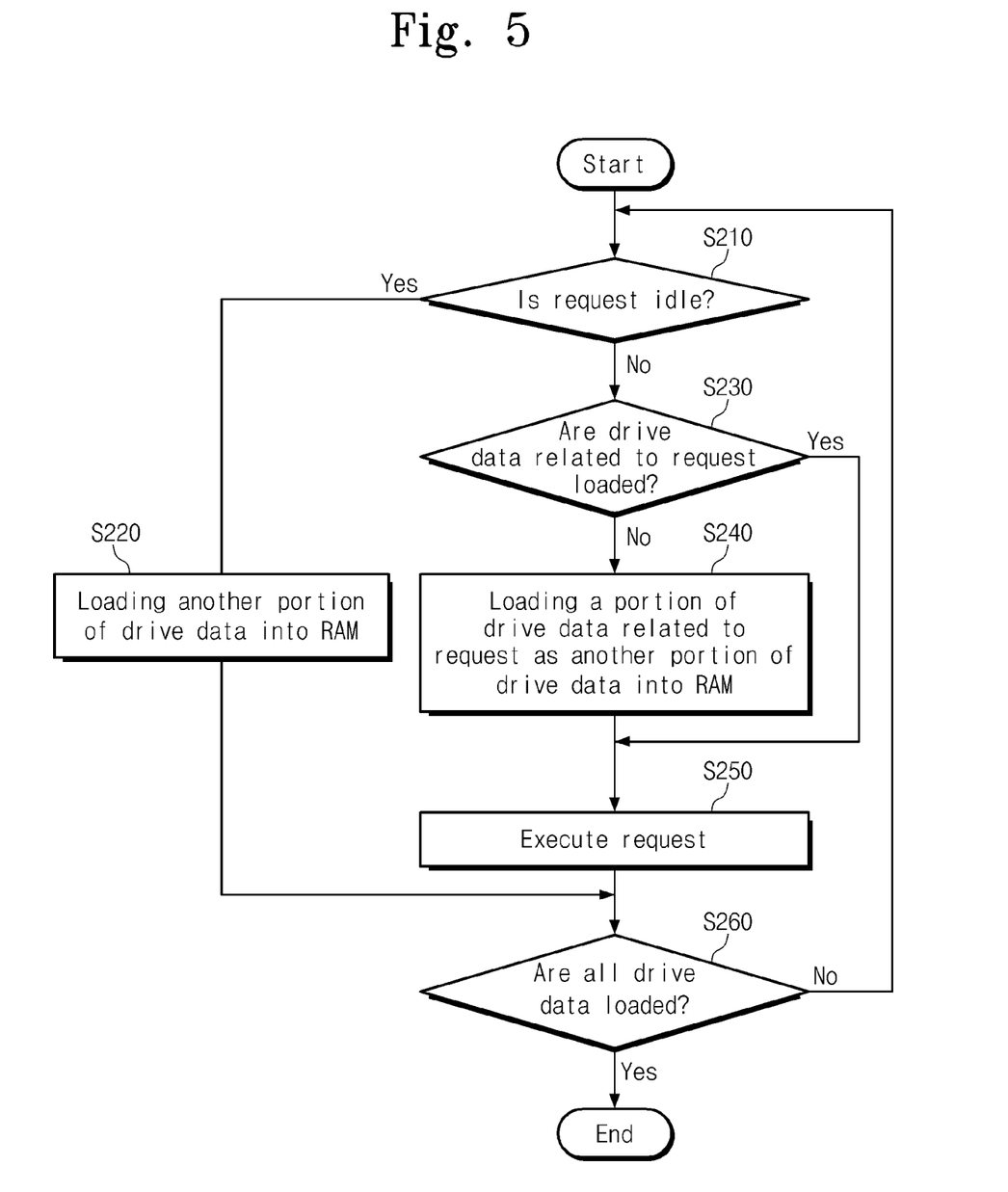
FIG. 5 is a flow chart illustrating a data loading step in the method of FIG. 3.

FIG. 5 is a flow chart illustrating a step of loading another portion of driving data 211 from nonvolatile memory device 200 into RAM 110 of controller 100. In other words, FIG. 5 illustrates an embodiment of step S140 in FIG. 3. Referring to FIGS. 4 and 5, in a step S210, it is determined whether or not the host has any current requests for operations by controller 100 or nonvolatile memory device 200. If not, a current request from the host is considered to be idle. Such an idle request can be indicated by any number of factors, including, e.g., the lack of a certain transmission from the host. Where the request from the host is idle, a step S220 is performed.

Next, in a step S220, another portion of drive data 211 stored in memory cell array 210 is loaded into RAM 110. In this embodiment, the other portion of drive data 211 comprises mapping table 215. Mapping table 215 may be loaded into RAM 110 at one time or at several times. If the size of mapping table 215 is smaller than a predetermined value, mapping table 215 may be loaded into RAM 110 at one time.

Where the size of mapping table 215 is greater than a predetermined value, mapping table 215 may be divided into a plurality of groups. For example, mapping table 215 may be divided into a first mapping table 215a, a second mapping table 215b, and a third mapping table 215c, where the size of each divided mapping table may be smaller than a predetermined value, and each of the divided mapping tables 215a, 215b and 215c may be loaded into RAM 110 as another portion of drive data 211.

Mapping table 215 may be divided using an address, such as a logical address. For example, first mapping table 215a may map first address through nth address (here, n is a positive integer) of the flash memory device 200. Second mapping table 215b may map nth address through mth address (m>n) of flash memory device 200. Third mapping table 215c may map mth address through pth address (p>m).

The method of dividing mapping table 215 may be variously applied and changed. For example, mapping table 215 may be divided using an address, such as a logical address, and a modular operation. Thus, the method of dividing mapping table 215 is not limited to that described above.

Mapping data 213b may comprise data about mapping table 215. For example, mapping data 213b may comprise data about the address ranges of the different portions of the divided mapping table.

In this embodiment, it will be assumed that the mapping table is divided into three. One of the divided first, second and third mapping tables 215a, 215b and 215c may be loaded into RAM 110 as another portion of drive data 211. However, mapping table 215 is not limited to being divided into three.

In step S210, if a request from the host is not idle (S210=NO), flow continues to step S230. For example, if a request of a read, a write or an erase from the host is transferred, step S230 is performed. Otherwise (S210=YES), flow continues to step S220.

Step S230 determines whether a portion of drive data 211 related to a request from the host is loaded into RAM 110. For example, step S230 may determine whether code for performing an operation requested by the host is loaded into RAM 110. For another example, it is determined whether a mapping table for performing a request of the host is loaded into RAM 110.

A request of a read, a write or an erase from the host is transferred with a corresponding address. An address transferred from the host may be a logical address. Memory cell array 210 of flash memory device 200 is accessed by a physical address. A mapping table representing a relation between a logical address and a physical address is required to perform a request of the host.

In the embodiment described above, mapping table 215 is divided into first mapping 215a, second mapping table 215b and third mapping table 215c, and the first through third mapping tables 215a, 215b and 215c are loaded into RAM 110 at three different times. Because they are loaded at different times, when a request is received from the host, parts of the mapping table may not be loaded into RAM 110.

Once a mapping table related to a request of the host is loaded into RAM 110, a step S250 can be performed. In step S250, an operation requested by the host is performed. Thereafter, step S260 is performed to determine whether all of drive data 211 has been loaded into RAM 110.

In step S230, if a portion of a mapping table required by a request from the host has not been loaded into RAM 110, a step S240 will be performed. In step S240, a portion of drive data 211 related to a request of the host is loaded into RAM 110. To accomplish this, a portion of drive data 211 related to a request of the host is first identified. Such a portion can be identified, for instance, by referring to a logical address contained in the request from the host. For instance, upon examining an address associated with a request from the host, controller 100 may consult mapping data 213b within RAM 110 to determine whether the mapping table (e.g., mapping table 215a, 215b, or 215c) corresponding to a relevant address in nonvolatile memory device 200 has been transferred to RAM 110.

Referring to mapping data 213b loaded into RAM 110, data, such as an address, regarding a region in which a detected mapping table is stored is detected. Using the detected address, it may be possible to access a mapping table related to a request of the host. The accessed mapping table is loaded into RAM 110 as another portion of drive data 211. Thereafter, in step S250, a request of the host is performed, and flow continues to step S260.

Step S260 determines whether all drive data 211 is loaded into RAM 110. Where all drive data 211 is loaded into RAM 110 (S260=YES), the method ends. In other words, step S140 of FIG. 3 is completed. Otherwise, (S260=NO), flow returns to step S210.

In short, where an initialization operation is performed in memory system 10, a portion of drive data 211 stored in flash memory device 200 is loaded into RAM 110 and an operation standby signal is activated. Thus, the time of the initialization operation may be reduced.

Thereafter, another portion of drive data 211 stored in the flash memory device 200 is loaded into RAM 110. When a request from the host is idle, another portion of drive data 211 may be loaded into RAM 110. Moreover, a portion related to a request of the host may be loaded into drive data 211 as another portion of drive data 211. Thus, it may be possible to load drive data 211 into RAM 110 while reducing an initialization operation time.

Figure 6:
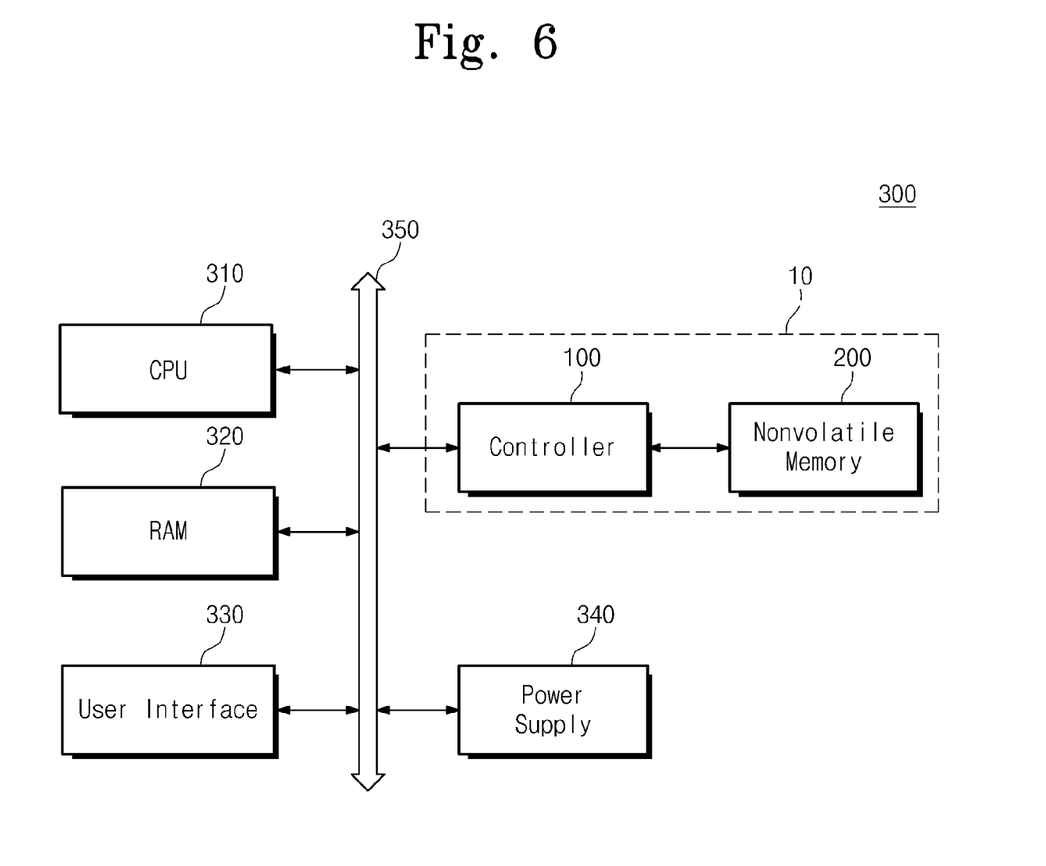
FIG. 6 is a block diagram illustrating a computing system comprising the memory system of FIG. 1.

FIG. 6 is a block diagram illustrating an embodiment of a computing system comprising the memory system illustrated in FIG. 1. Referring to FIG. 6, a computing system 300 comprises a central processing unit 310, a RAM 320, a user interface 330, a power supply 340 and memory system 10.

Memory system 10 is electrically connected to central processing unit 310, random access memory RAM 320, user interface 330 and power supply 340 via a system bus 350. Data provided by user interface 330 or processed by central processing unit 310 is stored in memory system 10. As in the above-described embodiments, memory system 10 comprises controller 100 and nonvolatile memory device 200.

As described with reference to FIGS. 1 through 5, in an initialization working memory system 10 loads a portion of a drive data into an operational memory and activate an operation standby signal. Thereafter, memory system 10 loads another portion of the drive data into a working memory.

Where memory system 10 is mounted in an SSD, a booting speed of computing system 300 may become high. A system in accordance with the inventive concept may further comprise an application chipset, a camera image processor, or the like.

Figure 7:
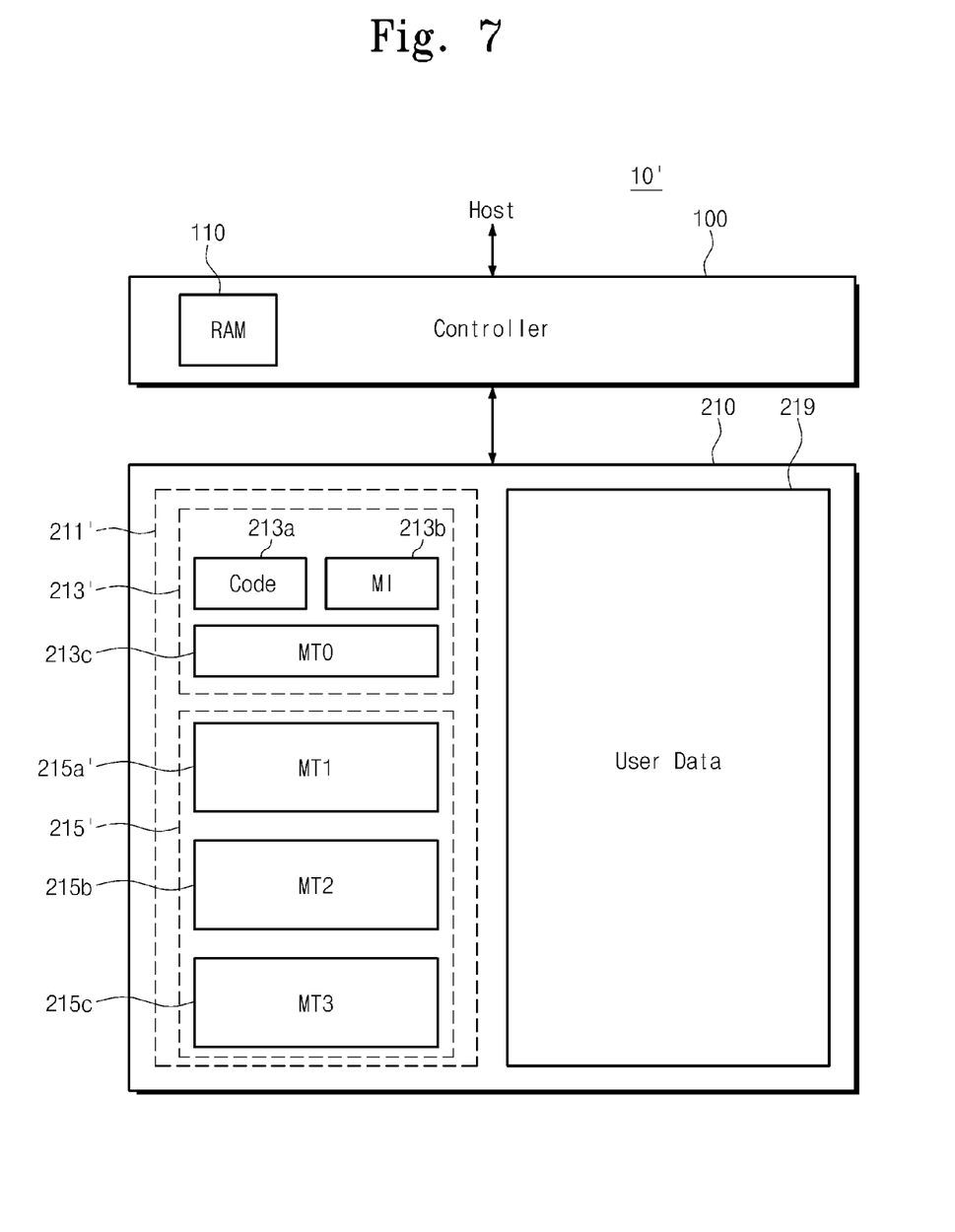
FIG. 7 is a block diagram illustrating a memory system in accordance with another embodiment of the inventive concept.

FIG. 7 is a block diagram illustrating a memory system 10' in accordance with another embodiment of the inventive concept. Referring to FIG. 7, memory system 10' comprises controller 100 and a nonvolatile memory cell array 210'.

Memory cell array 210' is similar to memory cell array 210 described above in relation to FIG. 4, and therefore a further description of nonvolatile memory cell array 210' is omitted to avoid redundancy. Moreover, controller 100 is configured to be operated in the same manner as described above with reference to FIGS. 1 through 6.

Memory cell array 210' is configured to store a drive data 211' and a user data 219. During an initialization operation, a portion 213' of drive data 211' is loaded into RAM 110 of controller 100. Portion 213' of drive data 211' may comprise code 213a, mapping data 213b and a portion 213c of a mapping table.

Memory system 10 may be used as a storage device for a booting of a host. Code 213a is loaded in RAM 110 when an initialization operation may comprise a booting code. In a booting operation of the host, the host requests a booting code before the user data. In an initialization operation of memory system 10, a booting code is loaded into RAM 110. Memory system 10 can transfer the booting code loaded into RAM 110 to the host. Thus, a booting speed of the host may be improved.

A portion 213c of a mapping table may map an address of a region in which a booting code is stored. In a booting operation of the host, the host typically requests the booting code before user data. In an initialization operation of memory system 10, the booting corresponding to portion 213c is loaded into RAM 110. Memory system 10 can access the booting code using portion 213c loaded into RAM 110. Thus, booting speed of the host may be improved.

Portion 213c of the mapping table may map an address of a region in which an operating system OS is stored. In a booting operation of the host, the host requests the operating system OS before user data. In the initialization operation of memory system 10, portion 213c of the mapping table, which corresponds to operating system OS, is loaded into RAM 110. Thus, memory system 10 can access operating system OS using portion 213c loaded into RAM 110. Thus, the booting speed of the host may be improved.

Portion 213c of the mapping table may map an address of a region in which file system data of memory system 10 is stored. If memory system 10 is connected to the host or when the host performs a booting operation, the host requires the file system data of memory system 10 before the user data. In an initialization operation of memory system 10, portion 213c of the file system data of memory system 10 is loaded into RAM 110. Memory system 10 can access the file system data using portion 213c of the mapping table loaded into RAM 110. Thus, a recognition speed of memory system 10 or a booting speed of the host may be improved.

Mapping table 215' may be divided as described with reference to FIGS. 1 through 6. As compared with memory system 10 described with reference to FIG. 4, portion 213c of the mapping table is separated from first mapping table 215a to be comprised in a portion 213' of drive data 211'.

As described with reference to FIGS. 1 through 6, after an operation standby signal is activated, the divided mapping tables 215a', 215b and 215c are loaded into RAM 110. Thus, drive data 211' can be loaded into RAM 110 while reducing an initialization speed.

As described with reference to FIG. 1, memory system 10' may form a memory card or an SSD. Memory system 10' may be implemented by components of various devices, and may be mounted in various types of packages.

As described with reference to FIG. 6, memory system 10 may be implemented as a component of computing system 300.

As an illustration, a portion 213 or 213' of drive data 211 or 211' is stored in a predetermined region of memory cell array 210 or 210'. In an initialization operation, controller 100 loads drive data 211 or 211' from the predetermined region of memory cell array 210, 210'.

In certain embodiments described above, the drive data comprises code, mapping data and a mapping table. However, the drive data is not limited to these elements. In alternative embodiments, the drive data may comprise various types of data required to perform a request of the host.

In certain embodiments described above, a portion of the drive data that is loaded in an initialization operation comprises code and mapping data. However, the portion of the drive data is not limited to code and mapping data. For instance, alternative embodiments, various portions of code, mapping data, and mapping tables may be loaded into a working memory during the initialization operation.

In certain embodiments described above, a memory system transfers an operation standby signal to a host after loading a portion of data into a working memory, such as a RAM. By doing so, the initialization time of the memory system may be reduced.

The foregoing is illustrative of embodiments and is not to be construed as limiting thereof. Although a few embodiments have been described, those skilled in the art will readily appreciate that many modifications are possible in the embodiments without materially departing from the novel teachings and advantages of the inventive concept. Accordingly, all such modifications are intended to be included within the scope of the inventive concept as defined in the claims. Therefore, it is to be understood that the foregoing is illustrative of various embodiments and is not to be construed as limited to the specific embodiments disclosed, and that modifications to the disclosed embodiments, as well as other embodiments, are intended to be included within the scope of the appended claims.

What is claimed is:

1. A memory system, comprising:
a nonvolatile memory device; and
a controller comprising a working memory and configured to control the nonvolatile memory device,
wherein the nonvolatile memory device stores drive data for accessing the nonvolatile memory device and wherein during an initialization operation of the memory system, the controller activates an operation standby signal after loading a sub-portion of the drive data stored in the nonvolatile memory device into the working memory,
wherein the controller loads an additional sub-portion of the drive data stored in the nonvolatile memory device into the working memory after activating the operation standby signal,
wherein the controller is configured to receive a request from the host, detect a sub-portion of the drive data required to perform an operation indicated by the request, and upon detecting the sub-portion of the drive data required to perform the operation indicated by the request, load the detected sub-portion into the working memory as the additional sub-portion of the drive data, and
wherein the size of the additional sub-portion of the drive data is set so that a time of loading the additional sub-portion of the drive data into the working memory is shorter than a response standby time of a host responsive to the operation standby signal.

2. The memory system of claim 1, wherein upon determining that the state of the request is idle, the controller loads another sub-portion of the drive data into the working memory as the additional sub-portion of the drive data.

3. The memory system of claim 1, wherein a sub-portion of the drive data comprises code and wherein another sub-portion of the drive data comprises a mapping table representing a relationship between logical addresses and physical addresses of the nonvolatile memory device.

4. The memory system of claim 3, wherein yet another sub-portion of the drive data comprises mapping data representing an address region in which the mapping table is stored.

5. The memory system of claim 3, wherein yet another sub-portion of the drive data comprises a table corresponding to an address region in which a file system among the mapping tables is stored.

6. The memory system of claim 3, wherein yet another sub-portion of the drive data comprises a booting code.

7. The memory system of claim 3, wherein yet another sub-portion of the drive data comprises a table corresponding to an address region in which an operating system among the mapping tables is stored.

8. The memory system of claim 1, wherein the nonvolatile memory device is a flash memory device.

9. A system, comprising:
a nonvolatile memory device storing drive data comprising (a) operating data used to perform different memory access operations on the nonvolatile memory device, and (b) meta-data comprising information about the operations associated with different parts of a mapping table;
a controller comprising a working memory and configured to control the nonvolatile memory device,
wherein during an initialization operation of the memory system, the controller activates an operation standby signal after loading the meta-data from the nonvolatile memory device into the working memory but before loading the operating data into the working memory; and
a host that sends requests to the controller to initiate memory access operations on the nonvolatile memory device after receiving the operation standby signal,
wherein the controller receives requests from the host, and upon receiving such a request, examines the meta-data to determine whether operating data required to satisfy the request has been loaded into the working memory, and
when an additional sub-portion of the meta-data is required responsive to the requests from the host, the size of the additional sub-portion of the meta-data is set so that a time of loading the additional sub-portion of the meta-data into the working memory is shorter than a response standby time of the host responsive to the operation standby signal.

10. The system of claim 9, wherein the operating data comprises a memory mapping table divided into multiple parts each containing mappings between logical and physical addresses of the nonvolatile memory device; and
wherein the meta-data comprises information regarding the logical addresses that can be accessed with each of the multiple parts of the mapping table.

11. The system of claim 9, wherein the operating data comprises code used by the controller to control memory access operations.

12. The system of claim 9, wherein the controller loads the required operating data to the working memory as a consequence of determining that the operating data required to satisfy the request has not been loaded into the working memory.

* * * * *